United States Patent
Chung et al.

(10) Patent No.: US 7,457,738 B2
(45) Date of Patent: Nov. 25, 2008

(54) METHOD FOR DECODING INSTRUCTION IN ARCHITECTURAL SIMULATOR

(75) Inventors: Sung-Woo Chung, Seoul (KR); Han-Jong Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 485 days.

(21) Appl. No.: 11/081,997

(22) Filed: Mar. 16, 2005

(65) Prior Publication Data

US 2005/0268289 A1 Dec. 1, 2005

(30) Foreign Application Priority Data

May 28, 2004 (KR) ............ 10-2004-0038327

(51) Int. Cl.
*G06F 17/50* (2006.01)
*G06F 9/44* (2006.01)
*H03M 13/00* (2006.01)

(52) U.S. Cl. ............... 703/14; 703/22; 716/6; 717/124

(58) Field of Classification Search ............ 703/16, 703/26, 14, 22; 716/5, 6; 717/146, 124, 717/106
See application file for complete search history.

(56) References Cited

U.S. PATENT DOCUMENTS

| | | | | |
|---|---|---|---|---|
| 5,452,239 | A * | 9/1995 | Dai et al. ............... | 703/19 |
| 6,446,241 | B1 * | 9/2002 | Mobley et al. ............... | 716/4 |
| 6,470,482 | B1 * | 10/2002 | Rostoker et al. ............... | 716/6 |
| 6,934,935 | B1 * | 8/2005 | Bennett et al. ............... | 717/127 |
| 7,080,365 | B2 * | 7/2006 | Broughton et al. ............... | 717/146 |
| 7,111,282 | B2 * | 9/2006 | Stephenson ............... | 717/130 |
| 2002/0019969 | A1 * | 2/2002 | Hellestrand et al. ............... | 716/5 |
| 2004/0098708 | A1 * | 5/2004 | Taruki et al. ............... | 717/138 |
| 2005/0091025 | A1 * | 4/2005 | Wilson et al. ............... | 703/16 |

FOREIGN PATENT DOCUMENTS

| | | |
|---|---|---|
| JP | 6-250874 | 9/1994 |
| JP | 10-83311 | 3/1998 |
| JP | 2000-89964 | 3/2000 |
| KR | 01-0055517 | 7/2001 |

* cited by examiner

*Primary Examiner*—Thai Phan
(74) *Attorney, Agent, or Firm*—Mills & Onello LLP

(57) ABSTRACT

In order to decode a simulation instruction in accordance with the present invention, a new decoding program is generated, which includes flat-type decoding codes for at least one of the instructions having a high occurrence frequency. The remaining instructions are decoded using tree-type decoding codes. By combining both flat-type and tree-type decoding operations in a single decoding program, simulation speed is increased while reducing memory requirements.

11 Claims, 5 Drawing Sheets

Fig. 2

<Tree Type>

```
B_27_0 : AND R1, IR, 0x8000000
         CMP R1, 0x8000000
         BEQ B_26_1
B_26_0 : AND R1, IR, 0x4000000
         CMP R1, 0x4000000
         BEQ B_25_1
B_25_0 : AND R1, IR, 0x2000000
         CMP R1, 0x2000000
         BEQ B_24_1
            ⋮
B_26_1 : AND R1, IR, 0x4000000
         CMP R1, 0x4000000
         BEQ B_25_2
            ⋮
B_20_1 : AND R1, IR, 0x0100000
         CMP R1, 0x0100000
         BEQ ADD_IMPL
            ⋮
ADD_IMPL :
            ⋮
```

```
        CMP  IR, #10010000
        BEQ  ADD_IMPL
        CMP  IR, #10000000
              ⋮
ADD_IMPL :
              ⋮
SUB_IMPL :
              ⋮
```

Fig. 6

```
                CMP  IR, 0x3100000
                BEQ  ADD_IMPL
                CMP, IR, 0x4000000
                BEQ  SUB_IMPL
B_27_0  :   AND  R1, IR, 0x8000000
                CMP  R1, 0x8000000
                BEQ  B_26_1
B_26_0  :   AND  R1, IR, 0x4000000
                CMP  R1, 0x4000000
                BEQ  B_25_1
B_25_0  :   AND  R1, IR, 0x2000000
                CMP  R1, 0x2000000
                BEQ  B_24_1
                     ⋮
B_26_1  :   AND  R1, IR, 0x4000000
                CMP  R1, 0x4000000
                BEQ  B_25_2
                     ⋮
B_20_1  :   AND  R1, IR, 0x0100000
                CMP  R1, 0x0100000
                BEQ  ADD_IMPL
                     ⋮
ADD_IMPL :
                     ⋮
SUB_IMPL :
                     ⋮
```

METHOD FOR DECODING INSTRUCTION IN ARCHITECTURAL SIMULATOR

CROSS-REFERENCE TO RELATED APPLICATIONS

This U.S. non-provisional patent application claims priority under 35 U.S.C. §119 to Korean Patent Application 2004-38327 filed on May 28, 2004, the entire contents of which are hereby incorporated by reference.

BACKGROUND OF THE INVENTION

The present invention relates to an architectural simulator and more specifically, to a method for decoding an instruction in an architectural simulator.

Generally, processes for developing a new integrated circuit or chip include hardware design, optimization and manufacturing steps. Chip simulation is used throughout all steps the process to verify chip operations at each stage and to evaluate a benchmark for optimizing chip conditions at each stage. Simulation parameters used for chip simulation are also eventually used to generate an application program for testing the chip following manufacture. Hardware Description Language (HDL) is a common low-level computer-based language for controlling such a simulation.

Generally, it takes long time to decode an instruction in a simulator environment. Therefore, if it is possible to reduce the time necessary for decoding an instruction, the total simulation time can be reduced.

SUMMARY OF THE INVENTION

The present invention provides a method for decoding an instruction in an architectural simulator in which the decoding speed is enhanced. In a decoding operation in accordance with the present invention, instructions having a high occurrence frequency are identified and are decoded in a flat-type decoding operation. Remaining instructions are decoded in a tree-type decoding operation. In this manner, by combing both flat-type and tree-type decoding operations, the overall simulation time for simulating an integrated circuit is reduced, while also reducing the amount of memory required for the operation, leading to a more efficient manufacturing operation.

In one aspect, the present invention is directed to a method for decoding simulation instructions. A decoding program is generated including flat-type decoding codes for at least one of the simulation instructions having a high frequency of occurrence. The simulation instructions are then decoded using the decoding program.

In one embodiment, the decoding program includes flat-type decoding codes for that at least one of the simulation instructions having the high frequency of occurrence and tree-type decoding codes for remaining simulation instructions.

In another embodiment, in decoding the simulation instructions, the decoding is preferentially performed by the flat-type decoding codes.

In another aspect, the present invention is directed to a method for decoding simulation instructions. A frequency of occurrence of each of the simulation instructions is counted while decoding the simulation instructions using tree-type decoding codes. A decoding program is generated including flat-type decoding codes for at least one of the simulation instructions having a high frequency of occurrence on the basis of the counted frequency of occurrence. The simulation instructions are decoded using the decoding program.

In one embodiment, the decoding program includes flat-type decoding codes for that at least one of the simulation instructions having the high frequency of occurrence and tree-type decoding codes for remaining simulation instructions.

In another embodiment, in the step of counting, the number of occurrences of each simulation instruction is counted while decoding a portion of the simulation instructions using the tree-type decoding codes during a time period.

In another embodiment, in decoding the simulation instructions using the decoding program, simulation instructions are preferentially decoded by the flat-type decoding codes and remaining simulation instructions are decoded by tree-type decoding codes. Instructions that are not decoded by the flat-type decoding codes are decoded by the tree-type decoding codes.

In another aspect, the present invention is directed to a method for decoding simulation instructions. The simulation instructions are decoded using a decoding program including both a flat-type decoding program for decoding simulation instructions having a high frequency of occurrence and a tree-type decoding program for decoding remaining instructions.

In one embodiment, a simulation instruction is preferentially decoded by a flat-type decoding program. A simulation instruction that is not decoded by the flat-type decoding program is decoded by a tree-type decoding program.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 2 is a code listing of a tree-type decoding operation.

FIG. 6 is a code listing of a decoding program in accordance with an embodiment of the present invention.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Like numerals refer to like elements throughout the specification.

Hereinafter, an exemplary embodiment of the present invention is described in conjunction with the accompanying drawings.

In general, a machine language instruction includes an operation code and an operand. In the present example, a 28-bit instruction is used, where the operation code comprises 8 high-ordered bits and the operand comprises the remaining low-ordered bits. However, sizes (or bit lengths) of the instruction, the operation code, and the operand may be variable, depending on the application and the type of device being employed.

Figure 1:
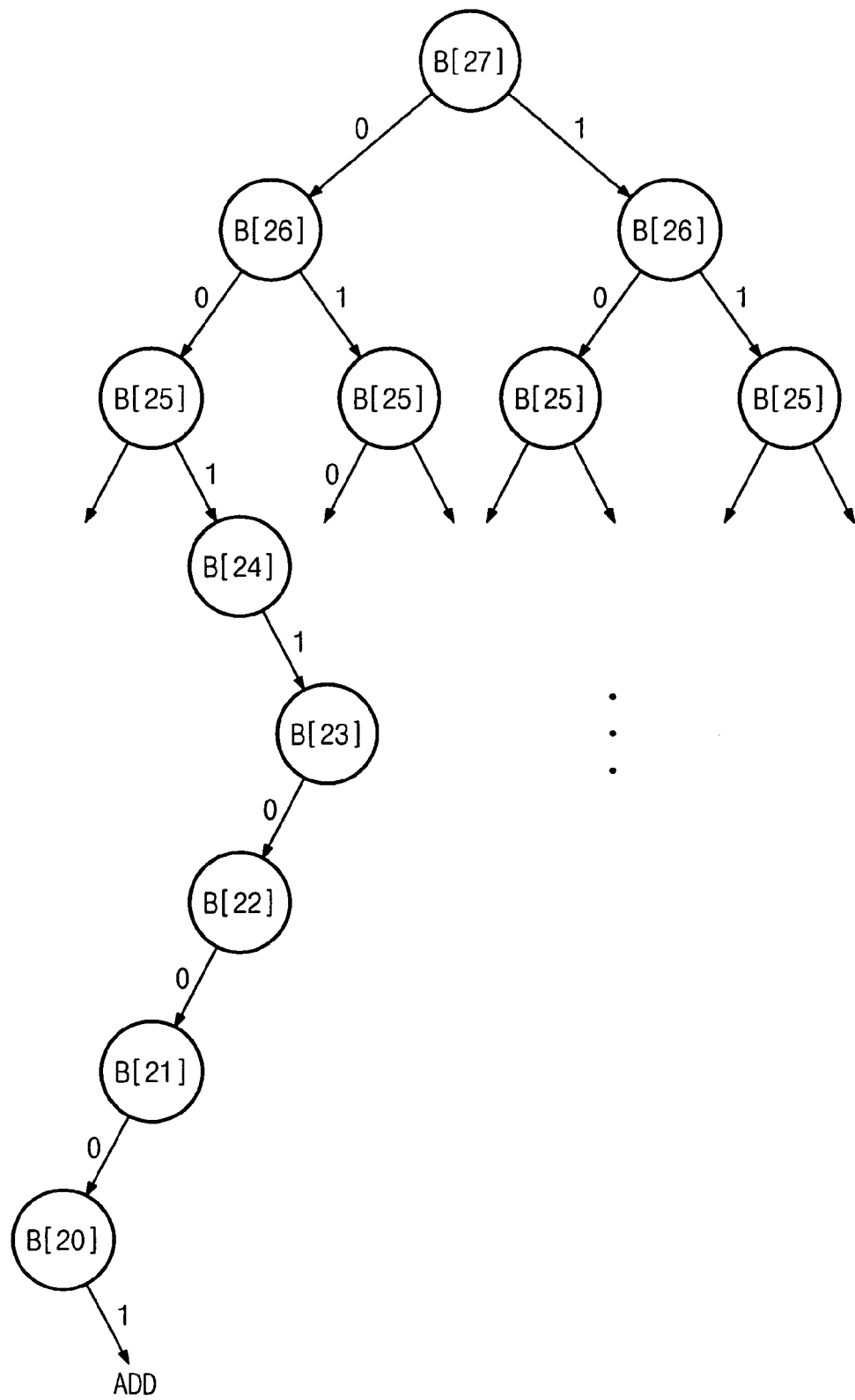
FIG. 1 illustrates a tree-type decoding operation.

An instruction decoding method (an operation code decoding method) can generally be classified into a tree-type and a flat-type. FIG. 1 illustrates an example of a decoding operation of the tree-type, and FIG. 2 is a code listing of an example tree-type decoding operation.

The tree-type decoding operation is a method by which the operation code B[27:20] is sequentially decoded from the most significant bit B[27] to the least significant bit B[20] so that a certain instruction is recognized. Such a tree-type operation characteristically has a long decoding time because the operation code B[27:20] is sequentially decoded bit by bit.

Figures 3, 4:
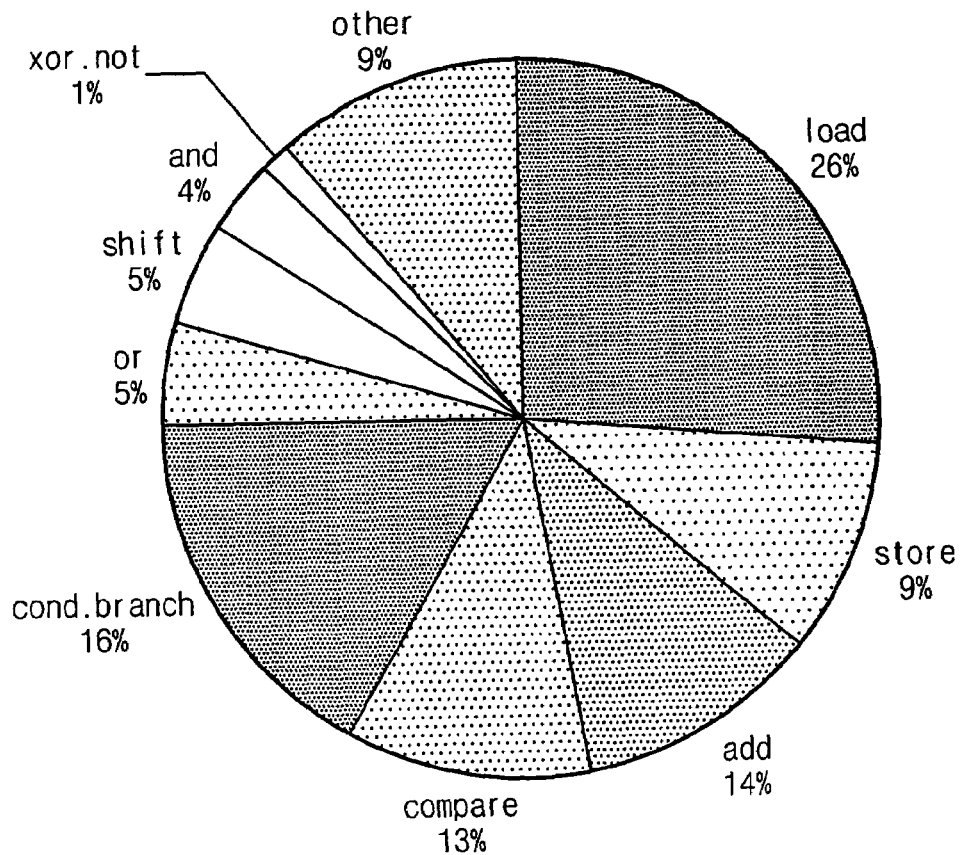
FIG. 3 is a code listing of a flat-type decoding operation.
FIG. 4 is a chart that illustrates a result of analyzing the frequency numbers of instruction sets employed when an application program is executed in a microprocessor.

FIG. 3 is a code listing of an example of a flat-type decoding operation. The flat-type operation is a method by which certain bits of the operation code B[27:20] are simultaneously compared with an instruction code. Although a flat-type decoding operation requires a large amount of memory, since decoding codes for all instructions need to be stored, the flat-type decoding operation offers the advantage of a fast decoding speed.

In the decoding operation of the present invention, the tree-type and the flat-type operations are combined so that advantages of each are utilized. Namely, decoding speed is improved, while reducing the amount of memory required for the operation. FIG. 4 is a chart that illustrates a result of analyzing the frequency numbers of instruction sets employed when an application program is executed in a microprocessor such as the type disclosed in Korea Patent Publication No. 2001-55517, incorporated herein by reference, indicating that several specific instruction words are primarily used while executing the program. From FIG. 4, it can be seen that certain instruction words such as "load", "conditional branch", "add", "compare" and "store" are more frequently used during program execution.

A decoding operation in accordance with the present invention improves the overall speed of the operation by decoding specific instructions that are used more frequently in a flat-type decoding operation and by decoding specific instructions that are used less frequently in a tree-type decoding operation.

Figure 5:
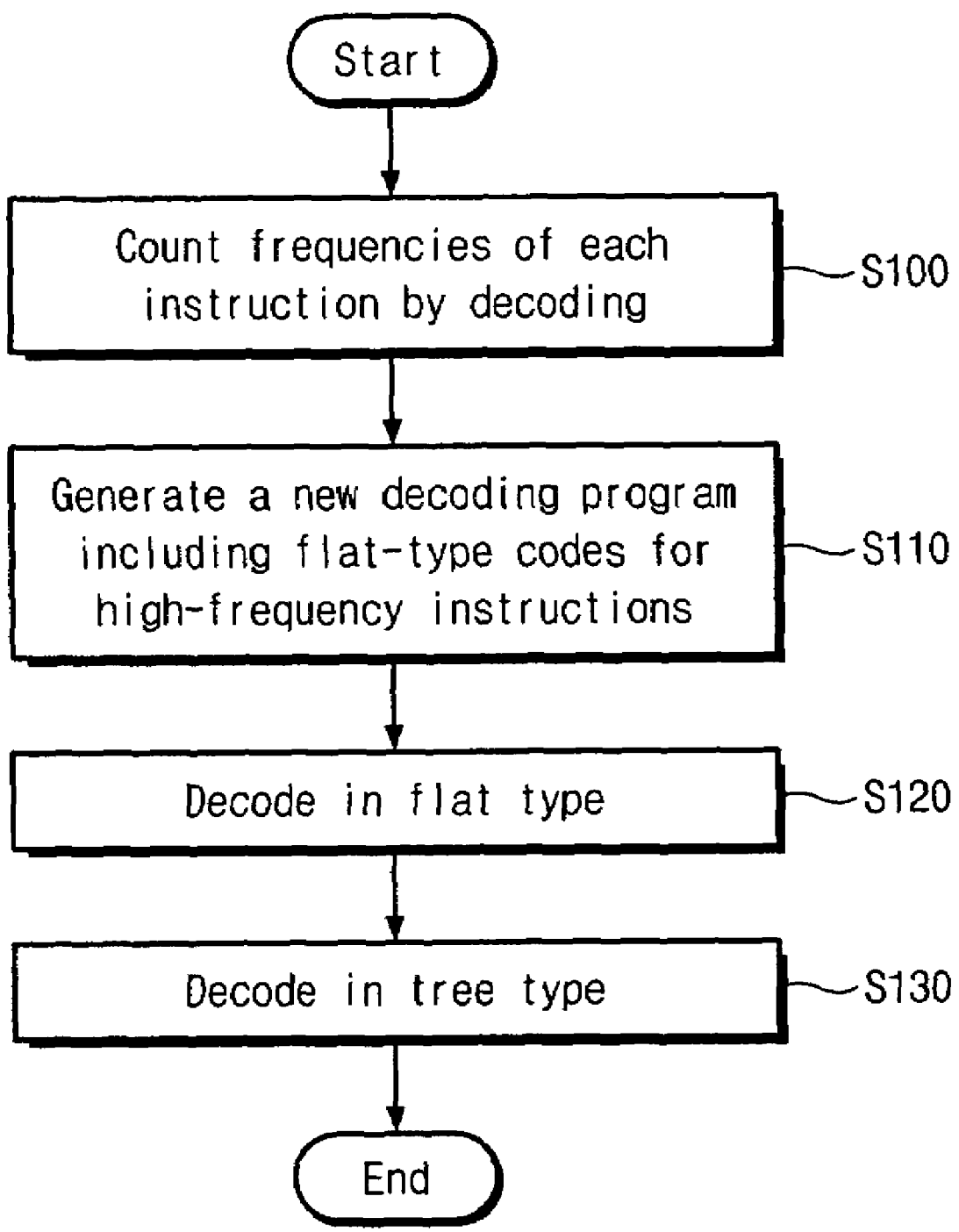
FIG. 5 is a flow chart illustrating a control procedure of a decoding method in accordance with a preferred embodiment of the present invention.

FIG. 5 is a flow chart illustrating a control procedure of a hybrid decoding method in which both tree-type and flat-type decoding procedures are utilized, in accordance with a preferred embodiment of the present invention. In step S100, first, a decoding operation for simulation instructions is performed for a desired time period using decoding codes of the tree-type shown in FIG. 2. The number of occurrences of each instruction is counted during the decoding procedure.

In step S110, decoding codes of the flat type for instructions that have high occurrence frequencies are generated. A new decoding program in accordance with a preferred embodiment of the present invention is thereby constructed, which includes both the generated decoding codes of the flat type and the decoding codes of the tree type shown in FIG. 2. An example of the new decoding program in accordance with a preferred embodiment of the present invention is shown in FIG. 6.

In step S120, the decoding operation of the flat type is performed for remaining instructions that are not decoded among the simulation instructions.

In step S130, the instructions that are not decoded by the decoding codes of the flat type are decoded by the decoding codes of the tree type.

In one embodiment, the types of instructions having a high frequency of occurrence can be arbitrarily set by a user. In such a case, step S100 is omitted, and decoding codes of flat type for instructions having a high occurrence frequency are determined by the user and codes of tree type are arranged in the step S120. Therefore, the simulation instructions are preferentially decoded in a flat type decoding operation, and then decoded in the tree type operation only when they have not been decoded in the flat type decoding operation.

In the decoding operation in accordance with the present invention, although the overall size of the program increases slightly since the flat-type decoding program for instructions having a high occurrence frequency is added to the decoding codes of the tree type operation, the decoding speed is remarkably enhanced. This is because the occurrence frequency of a few instructions is identified as being higher than that of other instructions in FIG. 4, and for those instructions having a high occurrence frequency, a flat-type decoding operation is utilized, which improves the decoding speed.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method for decoding simulation instructions, comprising:
    distinguishing simulation instructions having a high frequency of occurrence from simulation instructions having a low frequency of occurrence;
    generating a decoding program including flat-type decoding codes for at least one of the simulation instructions having a high frequency of occurrence; and
    decoding, in a flat-type operation code decoding operation using the generated decoding program, the simulation instructions using the decoding program.

2. The method as set forth in claim 1, wherein the decoding program includes flat-type decoding codes for that at least one of the simulation instructions having the high frequency of occurrence and tree-type decoding codes for remaining simulation instructions.

3. The method as set forth in claim 2, wherein, in decoding the simulation instructions, the decoding is preferentially performed by the flat-type decoding codes.

4. A method for decoding simulation instructions, comprising:
    counting a frequency of occurrence of each of the simulation instructions while decoding, in a tree-type operation code decoding operation, the simulation instructions using tree-type decoding codes;
    generating a decoding program including flat-type decoding codes for at least one of the simulation instructions having a high frequency of occurrence on the basis of the counted frequency of occurrence; and
    decoding, in a flat-type operation code decoding operation using the generated decoding program, the simulation instructions using the decoding program.

5. The method as set forth in claim 4, wherein the decoding program includes flat-type decoding codes for that at least one of the simulation instructions having the high frequency of occurrence and tree-type decoding codes for remaining simulation instructions.

6. The method as set forth in claim 4, wherein, in the step of counting, the number of occurrences of each simulation instruction is counted while decoding a portion of the simulation instructions using the tree-type decoding codes during a time period.

7. The method as set forth in claim 4, wherein, in decoding the simulation instructions using the decoding program, simulation instructions are preferentially decoded by the flat-type decoding codes and remaining simulation instructions are decoded by tree-type decoding codes.

8. The method as set forth in claim 7, wherein instructions that are not decoded by the flat-type decoding codes are decoded by the tree-type decoding codes.

9. A method for decoding simulation instructions, comprising:

distinguishing simulation instructions having a high frequency of occurrence from remaining simulation instructions having a low frequency of occurrence; and decoding the simulation instructions using a decoding program including both a flat-type decoding program for decoding, in a flat-type operation code decoding operation, the simulation instructions having a high frequency of occurrence and a tree-type decoding program for decoding, in a tree-type operation code decoding operation, remaining simulation instructions having a low frequency of occurrence.

10. The method as set forth in claim 9, wherein a simulation instruction is preferentially decoded by a flat-type decoding program.

11. The method as set forth in claim 10, wherein a simulation instruction that is not decoded by the flat-type decoding program is decoded by a tree-type decoding program.

* * * * *